(12) United States Patent
Oruganty

(10) Patent No.: US 7,884,616 B2
(45) Date of Patent: Feb. 8, 2011

(54) AUTOMATIC MULTICABLE ELECTRICAL CONTINUITY TESTER

(75) Inventor: Jagannatha Rao Oruganty, Coimbatore (IN)

(73) Assignee: Robert Bosch GmbH, Stuttgart (DE)

( * ) Notice: Subject to any disclaimer, the term of this patent is extended or adjusted under 35 U.S.C. 154(b) by 363 days.

(21) Appl. No.: 12/188,491

(22) Filed: Aug. 8, 2008

(65) Prior Publication Data

US 2010/0037110 A1     Feb. 11, 2010

(51) Int. Cl.
    *G01R 31/02*      (2006.01)
(52) U.S. Cl. ........................ 324/539; 324/527
(58) Field of Classification Search ........... 324/539, 324/527; 714/715, 824
See application file for complete search history.

(56) References Cited

U.S. PATENT DOCUMENTS

| | | | |
|---|---|---|---|
| 3,986,106 A | 10/1976 | Shuck et al. | |
| 4,224,690 A | 9/1980 | Rockwell | |
| 4,384,249 A | 5/1983 | Medina | |
| 4,445,086 A | 4/1984 | Bulatao | |
| 4,471,293 A | 9/1984 | Schnack | |
| 4,689,551 A * | 8/1987 | Ryan et al. | 324/539 |
| 4,772,845 A | 9/1988 | Scott | |
| 5,027,074 A | 6/1991 | Haferstat | |
| 5,072,185 A | 12/1991 | Rockwell | |
| 5,228,072 A | 7/1993 | Ingalsbe et al. | |
| 5,250,908 A | 10/1993 | Liu et al. | |
| 6,687,639 B2 | 2/2004 | Taniguchi et al. | |
| 6,744,257 B2 | 6/2004 | Taniguchi et al. | |
| 6,803,770 B2 | 10/2004 | Pereira et al. | |
| 7,620,858 B2 * | 11/2009 | Kushnick | 714/716 |
| 2002/0180457 A1 | 12/2002 | Taniguchi et al. | |
| 2002/0183954 A1 | 12/2002 | Taniguchi et al. | |
| 2004/0066202 A1 | 4/2004 | Pereira et al. | |
| 2006/0017453 A1 * | 1/2006 | Whetsel | 324/763 |
| 2007/0001683 A1 | 1/2007 | Krigel | |
| 2009/0039897 A1 * | 2/2009 | Fong | 324/537 |

* cited by examiner

*Primary Examiner*—Melissa J Koval
*Assistant Examiner*—John Zhu
(74) *Attorney, Agent, or Firm*—Michael Best & Friedrich LLP

(57) ABSTRACT

An automatic multi-cable continuity tester. The multi-conductor electrical continuity tester includes a controller that is configured to generate a first serial stream of input test signals. The first serial stream of input test signals includes a plurality of signals equal in number to a plurality of conductors in a cable. A data input module is configured to convert the first serial stream of input test signals into a first parallel stream of test signals. A data output module is configured to receive and convert the first parallel stream of test signals to a first serial stream of output test signals. The controller is further configured to receive the first serial stream of output signals, store the first serial stream of output signals to a memory, generate subsequent serial streams of input test signals corresponding to each possible combination and permutation of conductors, determine whether each possible combination and permutation of conductors includes an open circuit condition and/or a short circuit condition, and determine whether at least one predefined relationship between input and output test signals includes an open circuit condition and/or a short circuit condition, wherein the predefined relationship defines a stream of output test signals that are different than a stream of input test signals.

19 Claims, 9 Drawing Sheets

AUTOMATIC MULTICABLE ELECTRICAL CONTINUITY TESTER

BACKGROUND

The present invention relates to cable continuity testers and cable continuity testing.

In many situations, continuity testing involves using a digital or analog ohmmeter connected across positive and negative terminals of a circuit to measure the resistance and, in turn, determine the continuity or lack thereof in the circuit. Digital multimeters and ohmmeters are not, however, always practical or effective when testing multi-conductor cables. For example, a technician using an analog ohmmeter connects a first probe to a conductor on one side of a cable and places a second probe across the conductors on a second side of the cable to determine if adjacent conductors in the cable have shorted or are open circuited. The procedure is then repeated for each of the remaining conductors in the cable. Testing of this variety is commonly performed on, for example, hard drive cables and transmission control units (TCU). The procedure can be very time consuming and prone to error, depending on the number of conductors in the cable. As an example, a three-conductor cable includes a total of 8 combinations and 16 permutations of conductors that need to be tested, and the number of combinations and permutations of conductors increases considerably as the number of conductors increases.

SUMMARY

In light of the above issues, there is a need for methods and systems for performing rapid, accurate, and complete continuity testing of a cable or set of conductors, such as the conductors of a transmission control unit (TCU). The following summary sets forth certain embodiments of such methods and systems. However, it does not set forth all such embodiments. In addition, variations and modifications of the embodiments described are possible.

In one embodiment, the invention provides a multi-conductor electrical continuity tester that includes a controller, a data input module, and a data output module. The controller is configured to generate a first serial stream of input test signals (e.g., logic level voltage signals). The first serial stream of input test signals includes a plurality of signals equal in number to a plurality of conductors in a cable. The data input module is configured to convert the first serial stream of input test signals into a first parallel stream of test signals, which is then passed through the cable. The data output module is configured to receive and convert the first parallel stream of test signals to a first serial stream of output test signals. The first serial stream of output test signals is then sent to the controller. The controller is configured to receive the first serial stream of output signals, store the first serial stream of output signals to a memory, generate subsequent serial streams of input test signals corresponding to each possible combination and permutation of conductors, determine whether each possible combination and permutation of conductors includes an open circuit condition and/or a short circuit condition, and determine whether at least one predefined relationship between input and output test signals includes an open circuit condition and/or a short circuit condition, wherein the predefined relationship defines a stream of output test signals that are different than a stream of input test signals.

As an example, conductors are sometimes intentionally shorted together such that the conductors are at the same voltage level. During a normal continuity test, various conductors being shorted together results in a failure or "fail" result. However, a user can access and modify the instructions stored within the controller to adapt the testing procedure to accommodate known exception(s). As a result, when shorted conductors are tested, the continuity test is passed in spite of the conductors being shorted together.

In another embodiment, the invention provides a method of testing a multi-conductor cable for continuity. The method includes generating a first serial stream of input test signals that includes a plurality of signals equal in number to a plurality of conductors in a test. The first serial stream of input test signals is converted into a first parallel stream of test signals, buffered, and sent through the cable to a data output module. The first parallel stream of test signals is converted to a first serial stream of output test signals, sent to a controller, and stored in a memory. The method also includes generating subsequent serial streams of input test signals corresponding to each possible combination and permutation of conductors, determining whether each possible combination and permutation of conductors includes an open circuit condition and/or a short circuit condition, determining whether at least one predefined relationship between input and output test signals includes an open circuit condition and/or a short circuit condition, wherein the predefined relationship defines a stream of output test signals that are different than a stream of input test signals, and displaying a result of the test on a user interface. Other aspects of the invention will become apparent by consideration of the detailed description and accompanying drawings.

DETAILED DESCRIPTION

Before any embodiments of the invention are explained in detail, it is to be understood that the invention is not limited in its application to the details of construction and the arrangement of components set forth in the following description or illustrated in the following drawings. The invention is capable of other embodiments and of being practiced or of being carried out in various ways.

Figure 1:
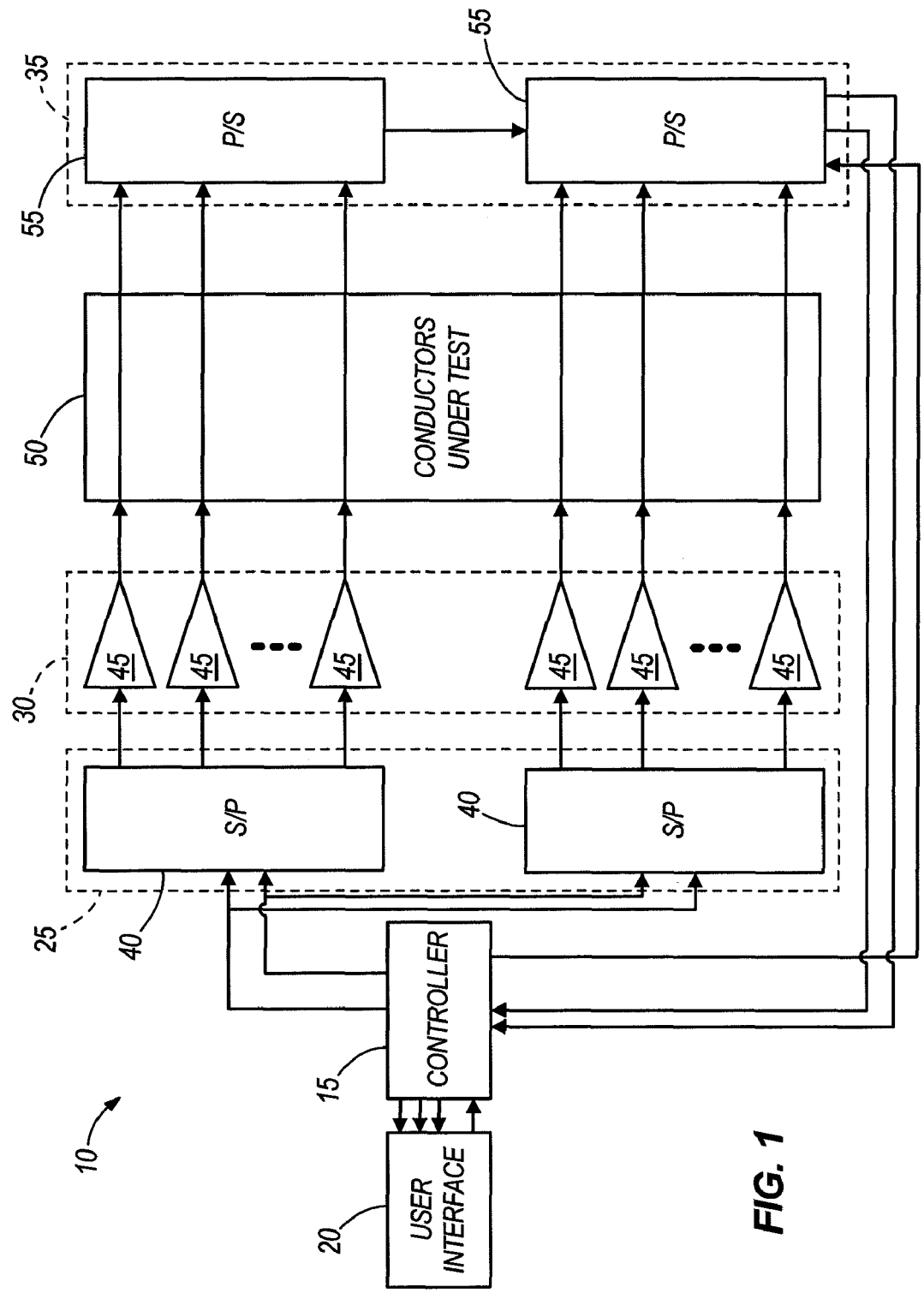
FIG. 1 illustrates a multi-conductor electrical continuity tester according to an embodiment of the invention.

FIG. 1 illustrates a multi-conductor electrical continuity tester 10 that includes a controller 15, a user interface 20, a data input module 25, a buffer module 30, and a data output module 35. The controller 15 includes, for example, a processing unit, a memory, and a bus. The bus connects various components of controller 15 including the memory to the processing unit. The memory includes, in many instances, read only memory (ROM) and random access memory (RAM). The controller 15 also includes an input/output system that includes routines for transferring information between components within the controller 15. Software included in the implementation of the continuity tester of FIG. 1 is stored in the ROM or RAM of the controller 15. The software includes, for example, firmware applications and other executable instructions. In other embodiments, the controller 15 can include additional, fewer, or different components.

The controller 15 is configured to generate and send a serial stream of input test data to the data input module 25. The serial stream of input test data includes a plurality of signals that is equal in number to the number of conductors being tested. The serial stream of data is, for example, a bit stream of 0's and 1's which correspond to a low voltage condition (e.g., a logical low or 0V) or a high voltage condition (e.g., a logical high or 5V), respectively.

The user interface 20 includes at least one indicator for providing feedback to a user and at least one actuation device for receiving input from the user. The indicators are, for example, light emitting diodes (LEDs), a liquid crystal display (LCD), a speaker, etc. The actuation device is, for example, a push button, a toggle switch, a capacitive sensor, a touch screen display, or the like. The actuation device is operable to initiate a control action such as starting a test, stopping the test, or pausing the test. In some embodiments, a test is initiated as soon as a conductor is attached to the continuity tester 10 (assuming the tester 10 is powered). In other embodiments, the user must activate the actuation device or a start button to initiate the test. After the test is completed, a result of the test is displayed on the user interface 20. The result of the test is either a pass or a fail and is indicated by the at least one indicator. Additionally or alternatively, a complete and detailed compilation of the test results can be sent from the controller 15 to an external device such as a personal computer (PC), a smartphone, a server, or a similar device, as described below.

The data input module or section 25 includes at least one static serial-to-parallel integrated shift and store circuit 40. The controller 15 sends the serial stream of input test data to the data input section 25. The serial stream of input test data is then clocked into the serial-to-parallel circuits. The circuits latch the input data to ensure the reception and integrity of the input test data. The circuits then convert the serial stream of input test signals to a parallel stream of output test data. The serial-to-parallel integrated shift and store circuits also reduce the number of input/output (I/O) pins required by the controller 15.

A plurality of buffer amplifiers 45 in the buffer module 30 are configured to provide high input impedance to the output of the digital input section and low output impedance to a set of conductors 50 under test, to prevent loading of the input test signal. The conductors 50 under test are, for example, wires, a cable, a harness, or any combination thereof. In some embodiments, the buffer amplifiers 45 are also configured to provide gain to the input test signals to correct for attenuation that occurs during testing.

The data output module or section 35 includes at least one static parallel-to-serial integrated shift and store circuit 55. The data output section receives the parallel stream of test signals from the cable 50 under test. The parallel stream of test data is then clocked into the parallel-to-serial integrated shift and store circuit. The parallel-to-serial circuits also latch the parallel stream of data to ensure the reception and integrity of the test data. The integrated circuits then convert the parallel stream of test signals to a serial stream of output test data, and the serial stream of output test data is sent to the controller 15 for evaluation.

Figure 2:
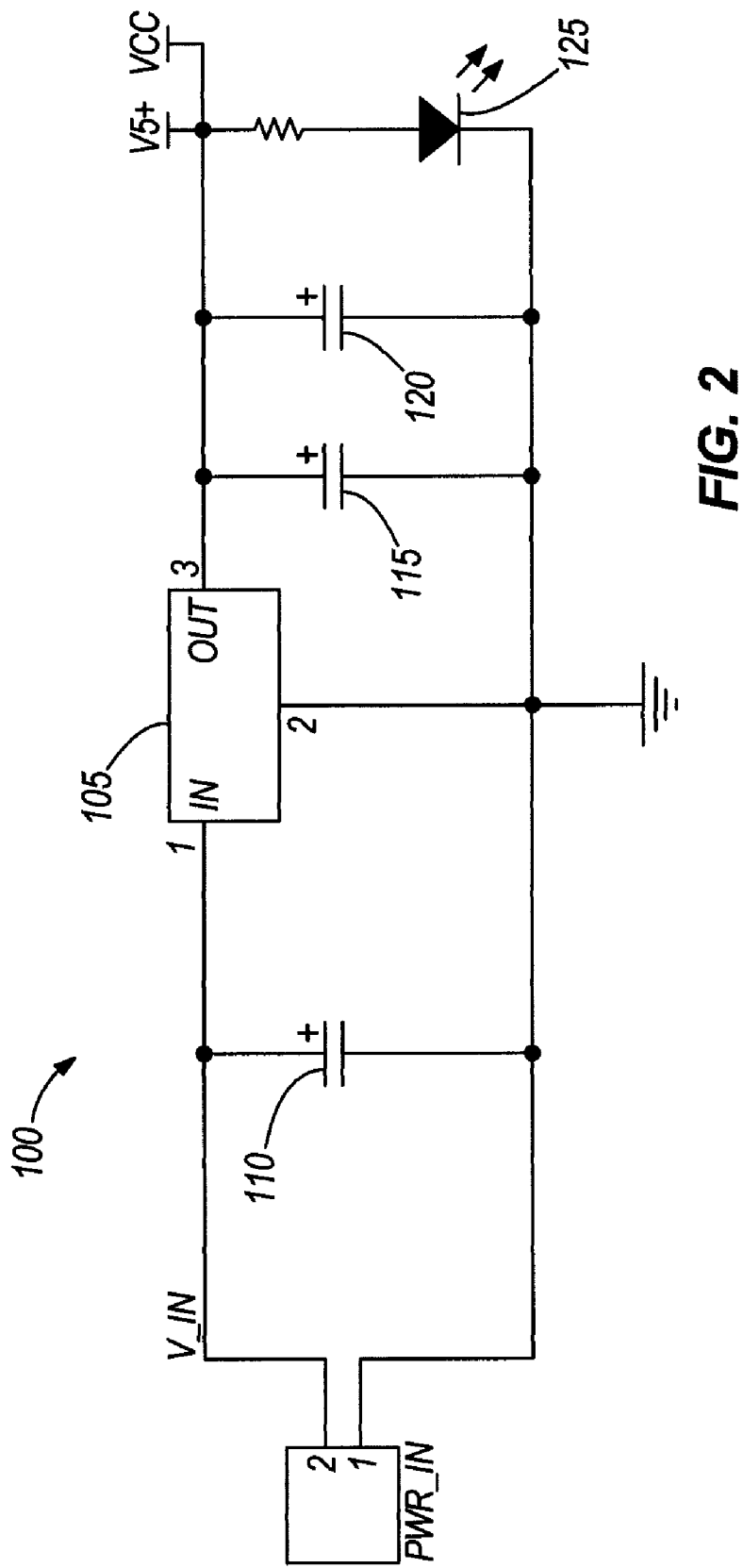
FIG. 2 is a diagram of a power input section for the continuity tester of FIG. 1.

FIG. 2 illustrates a power supply section 100 of the electrical continuity tester 10. The power supply section 100 includes, among other things, a linear regulator 105. The linear regulator 105 converts an incoming voltage to a regulated DC voltage of, for example, 5V, which is required by the controller 15 and other circuitry within the continuity tester 10. A set of capacitors 110, 115, and 120 are provided to filter the input and output voltages of the power supply section 100. When the power supply section 100 is receiving power and outputting a proper regulated voltage, an LED 125 or other indicator is activated to indicate that the power supply section 100 of the continuity tester 10 is functioning. In some embodiments, the power supply section 100 operates from input voltages in the range of, for example, 8V to 30V. In other embodiments, the power supply section 100 includes more, fewer, or different components and can operate correctly at a different range of input voltages or a different regulated DC voltage.

Figure 3:
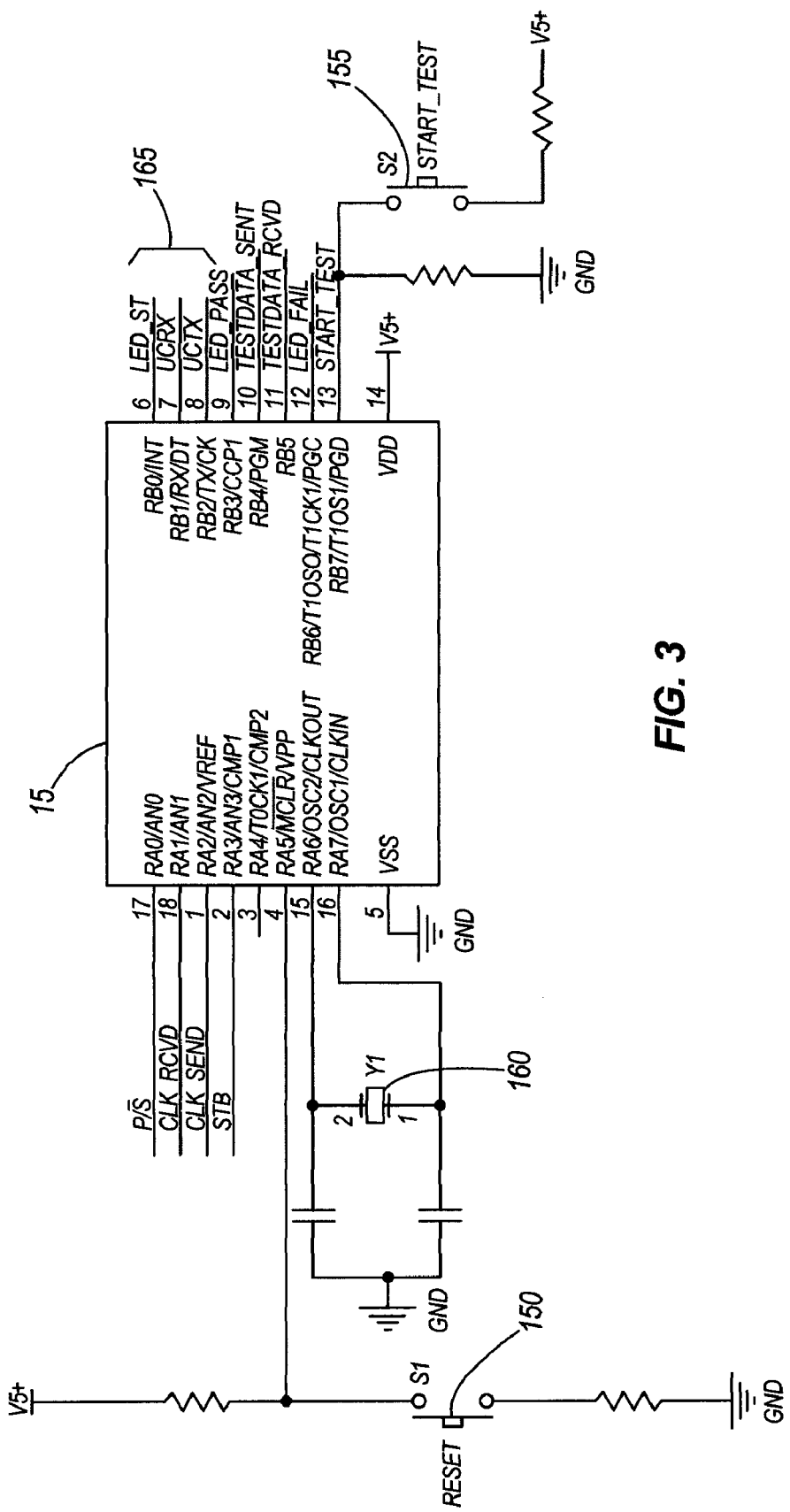
FIG. 3 is a diagram of a controller for the continuity tester of FIG. 1.

FIG. 3 illustrates the controller 15 as well as the input signal lines to and output signal lines from the controller 15. For example, the controller 15 is connected to a reset button 150, a start button 155, and a crystal oscillator 160. The controller 15 sends the serial stream of input test data, receives the serial stream of output test data, analyzes the test data, and provides a signal to the user interface 20 to indicate whether a cable 50 passed or failed the continuity test. The controller also includes an input/output interface 165 for interfacing with an external device such as a personal computer, a laptop, a server, an external hard drive, or the like.

Figure 4:
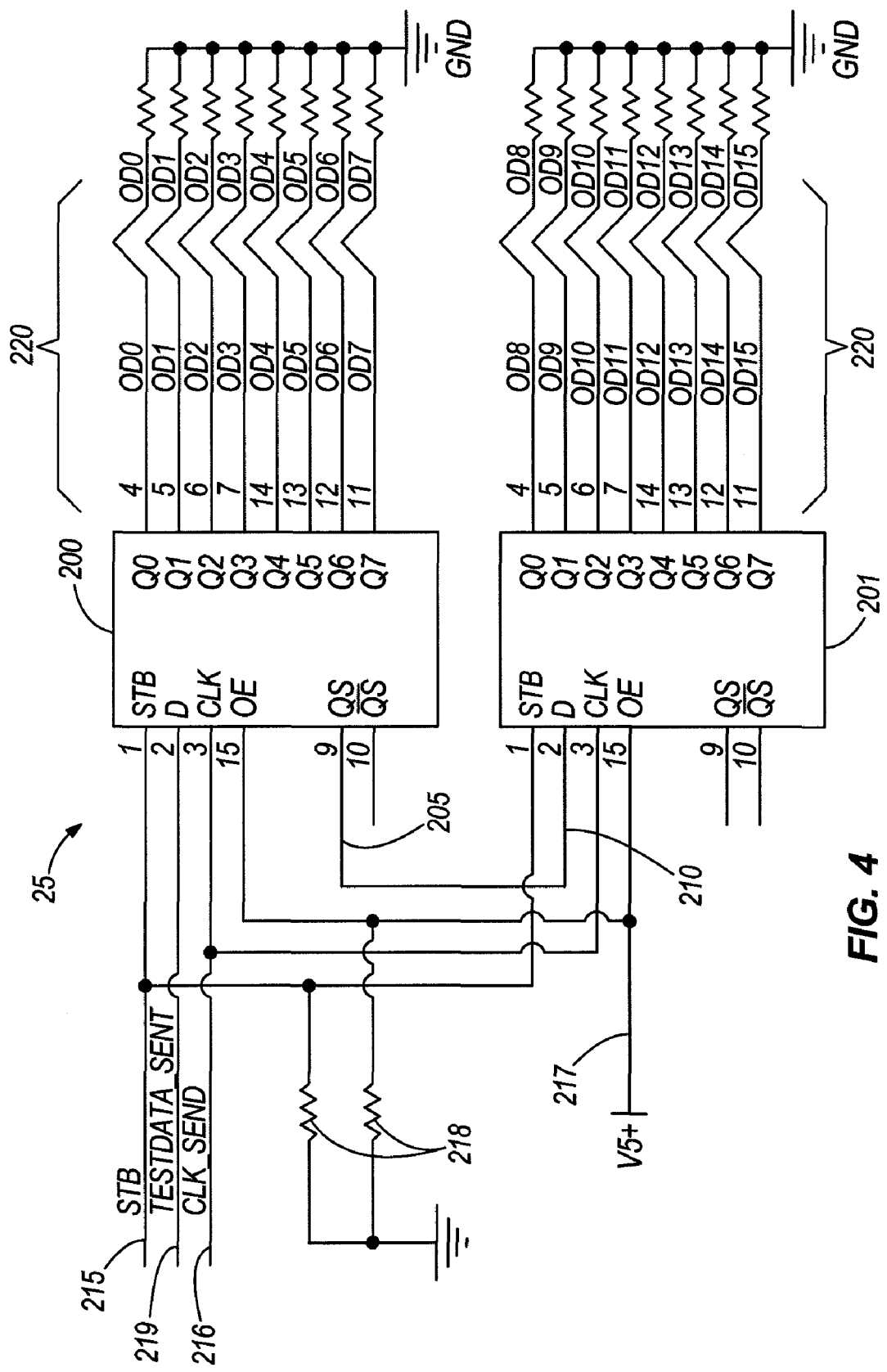
FIG. 4 is a diagram of a data input section for the continuity tester of FIG. 1.

FIG. 4 illustrates a schematic representation of the data input section 25. In the illustrated embodiment, the data input section 25 includes two integrated shift and store circuits 200 and 201. Each integrated circuit accepts an 8-bit serial input data stream and outputs a corresponding 8-bit parallel data stream. The illustrated data input section can accommodate up to sixteen conductors during a single test. In other embodiments, the continuity tester 10 can accommodate additional conductors by cascading additional integrated shift and store circuits. To cascade the integrated circuits, the output 205 of the first integrated shift and store circuit 200 is coupled to a data-in line 210 of the second integrated shift and store circuit 201. The same technique is used to cascade the additional integrated shift and store circuits required to test a greater number of conductors. Strobe (STB) 215, clock (CLK) 216, and an output enable (OE) 217 lines are each tied to respective inputs of the integrated shift and store circuits 200 and 201. Each of the lines 215, 216, and 217 are triggered independently for each of the integrated shift and store circuits 200 and 201. The OE line 217 is permanently connected to 5V to ensure that the parallel stream of data is available to the cable 50. Pull-down resistor 218 on the STB 215 line keeps the line at a logical low value when not receiving signals from the controller to prevent electrical noise from triggering the circuit. The value for pull down resistor 218 is chosen such that the quiescent current and operational current through the resistor 218 is minimized while continuing to provide reliable logic levels (e.g., TTL logic levels).

The serial stream of input test data is sent from the controller 15 to the data-in line 219 of the first integrated circuit 200. The serial stream of input test data is then clocked into the first integrated circuit 200 after receiving a signal from the controller 15 on the CLK line 216. If the serial stream of input test data exceeds the 8-bit limit of the first integrated circuit 200, the remaining bits are automatically clocked into the second integrated circuit 201. The serial stream of input data is sent to the integrated circuits 200 and 201 in a "most significant bit" (MSB) to a "least significant bit" (LSB) form because of the shift sequence of the integrated circuits 200 and 201. After the serial stream of input test data has been transferred to the latches of the integrated circuits 200 and 201, the controller 15 triggers the STB line 215 to cause the input data to appear as a parallel stream of data on a parallel data bus 220 represented by OD0-OD15 in FIG. 4. The parallel stream of data on the parallel data bus 220 corresponds to the serial stream of input test data from the controller 15.

Figure 5:
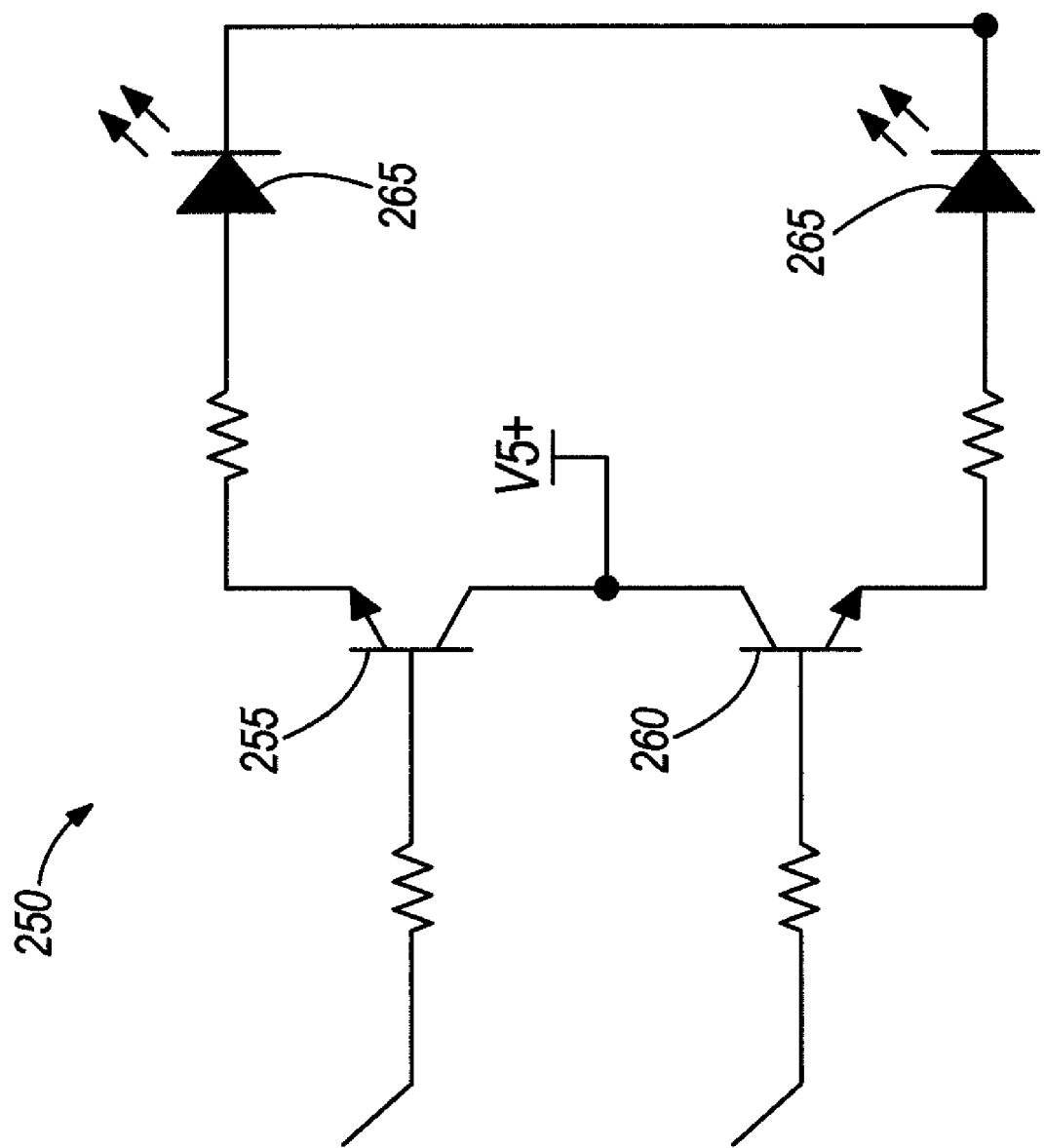
FIG. 5 illustrates buffer amplifiers according to an embodiment of the invention.

Buffer amplifiers 250 (illustrated in FIG. 5) are configured to couple input data to a cable under test and include, for example, discrete transistors 255 and 260 configured as emitter followers and to condition the parallel stream of data. The emitter-follower configuration provides high input impedance and low output impedance. The high input and low output impedance of the emitter followers 255 and 260 prevent loading and signal distortion due to unwanted noise in the test signals. Additionally, the emitter followers 255 and 260 are non-inverting amplifiers that can amplify the test signals without inverting them. Values for resistors and other components used in the buffer amplifiers 250 are selected to ensure that the transistors 255 and 260 are operating in saturation mode based upon the logic levels of the integrated circuits. A plurality of LED's 265 is connected to the emitter of the transistors 255 and 260 to provide a visual confirmation of the progress of the test. The LED's 265 are also functional for debugging the wiring of the tester circuit. The component values in the emitter followers can be selected to allow for larger or smaller detection ranges for short circuits between conductors. For example, in one embodiment, the buffer amplifiers 250 are designed such that the continuity tester 10 can detect a short circuit between two conductors with up to 500 ohms of resistance between them.

Figure 6:
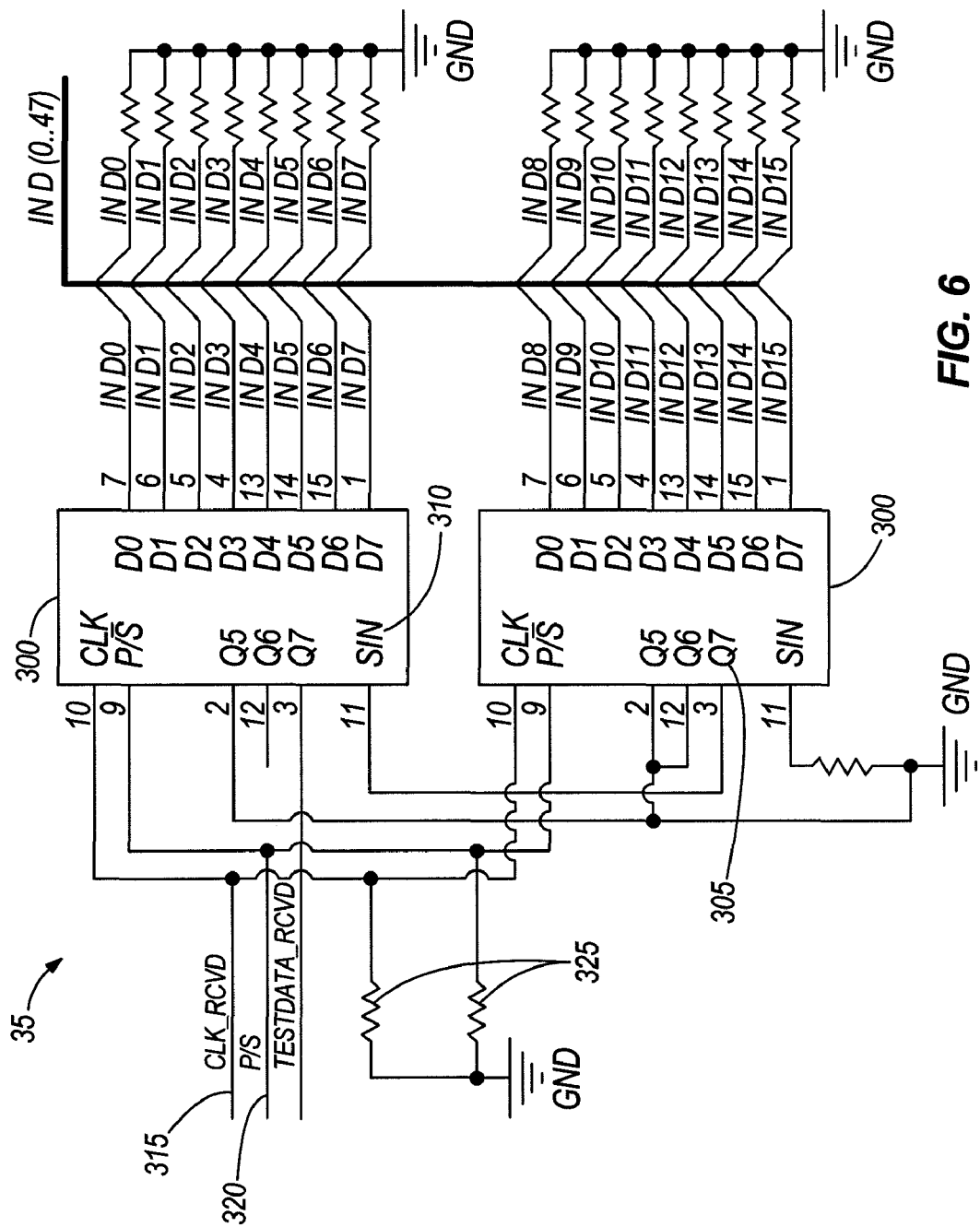
FIG. 6 is a diagram of a data output section for the continuity tester of FIG. 1.

FIG. 6 illustrates the data output section 35. The data output section 35 converts the parallel stream of data passed through the cable 50 into a serial stream of output data. In the embodiment illustrated in FIG. 6, the data output section 35 includes two integrated shift and store circuits 300 and 301. Each integrated circuit is capable of converting 8-bits of parallel data into an 8-bit serial stream. If a test is performed on more than eight conductors (as in FIG. 6), the integrated circuits are cascaded together as described above with respect to FIG. 4. A serial output 305 of the second integrated circuit 301 is coupled to the serial data input 310 of the first integrated circuit 300. A similar technique of cascading integrated circuits is used if additional integrated circuits are needed (i.e., testing more than 16 conductors). A CLK line 315 and parallel-to-serial (P/S) line 320 are each tied to respective inputs on each of the first and second integrated circuits 300 and 301. The controller 15 provides a signal on the P/S line 320 which latches the parallel data on the parallel bus into the internal registers of the integrated circuits 300 and 301. A signal from the controller 15 on the CLK line 315 outputs the latched parallel data in the integrated circuits 300 and 301 as a serial stream of output data. The serial stream of output data corresponds to the parallel stream of data that was latched into the internal registers of the integrated circuits 300 and 301. As a result of the cascading technique used for the integrated circuits 300 and 301 in the data output section 35, the serial stream of output data is organized with the LSB first and the MSB last, which is the opposite of the digital input section 25. The data is then sent to the controller 15 after the data output section 35 receives the next controller signal on the P/S line 320. Pull down resistors 325 maintain the CLK 315 and P/S 320 lines at a logical low level to prevent noisy electrical signals from triggering the circuits 300 and 301. As described above with respect to FIG. 4, resistor and capacitor values are chosen such that the quiescent and operational currents are minimized while continuing to provide reliable logic levels. Buffer amplifiers are not required preceding or following the data output section because the test signals have already been amplified to compensate for attenuation through the continuity tester.

Figure 7:
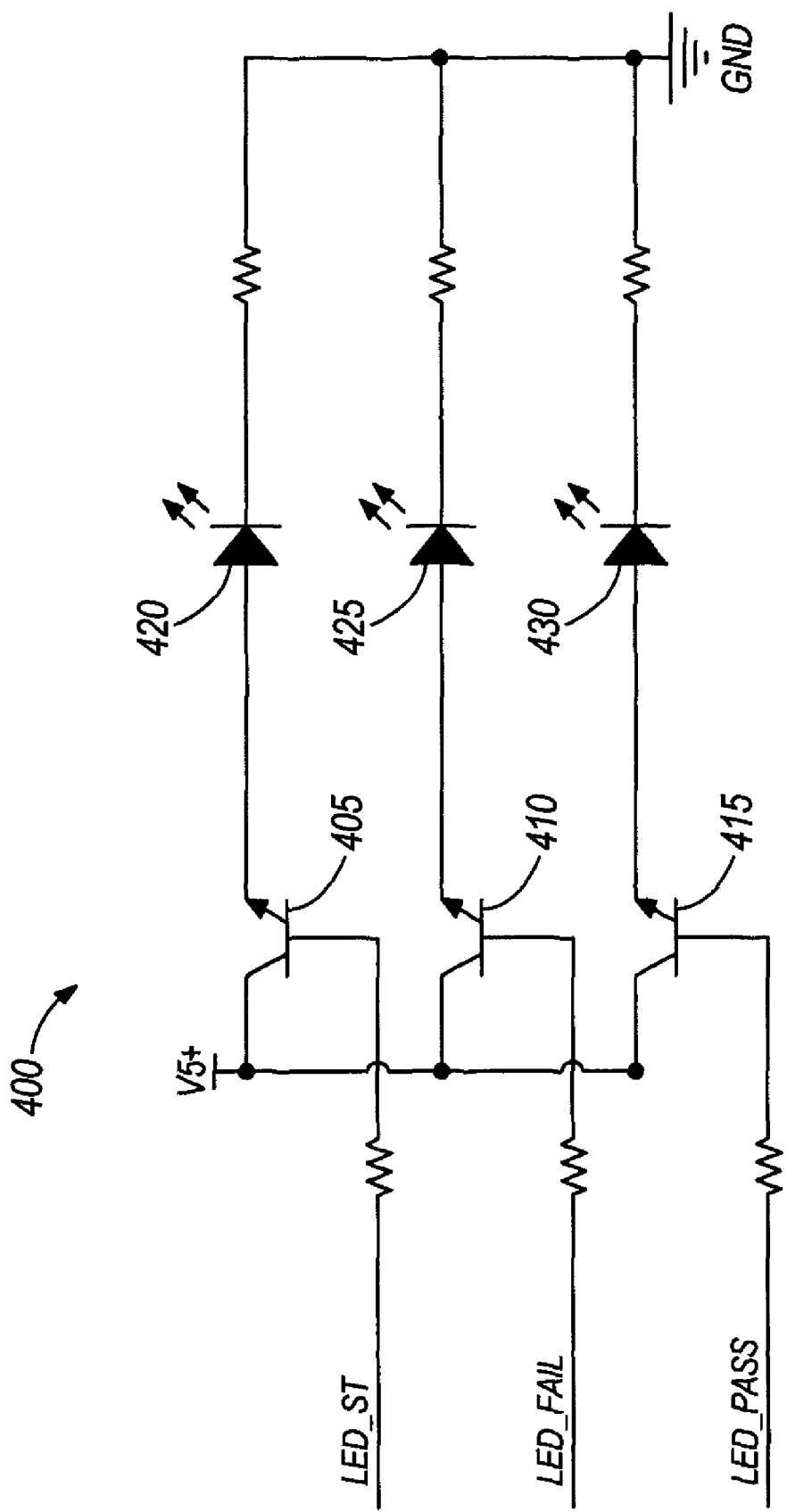
FIG. 7 is a diagram of a control and status section for the continuity tester of FIG. 1.

A control and status circuit 400 is schematically illustrated in FIG. 7. The status and control circuit 400 includes transistors 405, 410, and 415 which are configured as electrical switches and control light emitting diodes (LEDs) 420, 425, and 430, respectively. The controller 15 provides a logical high value to a respective transistor to light a corresponding LED. For example, a red LED and a green LED can, respectively, indicate a fail or pass of the conductors under test. A yellow LED can then be used to indicate that the tester is ready for another test. A test is initiated when a user activates a switch or depresses a button, which is, in turn, connected to the controller and sends the controller a signal to initiate the test.

Figure 8:
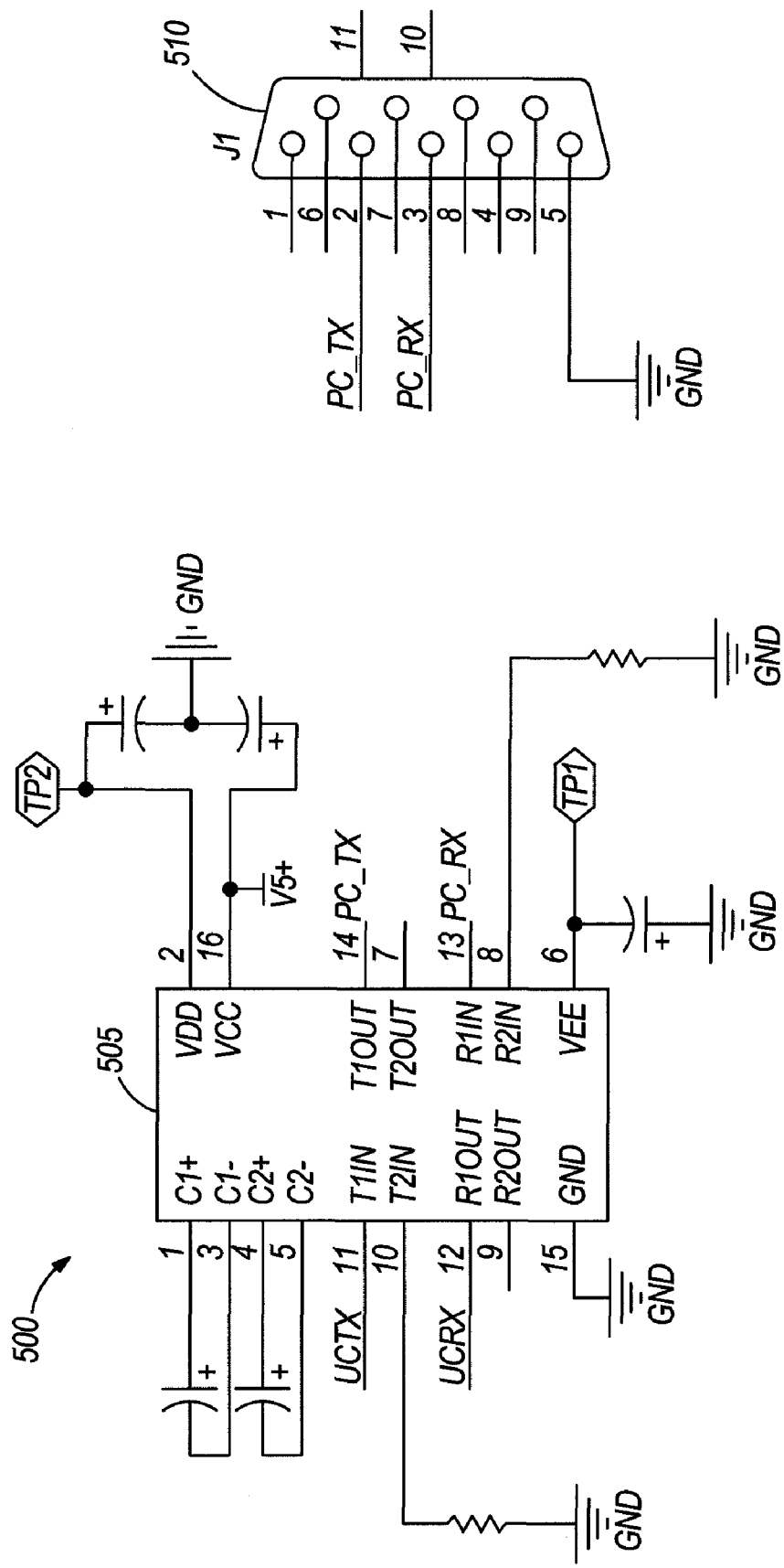
FIG. 8 is a diagram of a communications port section for the continuity tester of FIG. 1.

FIG. 8 illustrates a communications port section 500 for connecting the controller 15 with an external device. The communications port section 500 allows the controller 15 to connect to and communicate with an external device (e.g., a PC, a laptop, a server, a handheld device, or the like). In particular, the controller 15 can send or transfer a detailed listing and analysis of test results for a given set of conductors. In the illustrated embodiment, the communications port section 500 uses an RS232 (serial connection) circuit 505 and an RS232 port 510. Recording results from the tester 10 can then be accomplished using a tool such as HyperTerminal or an equivalent program to access test result data. In other embodiments of the invention, different interfaces or ports are used to connect the controller 15 to external devices, such as a universal serial bus (USB), Bluetooth, Wi-Fi, or like interfaces.

Figure 9:
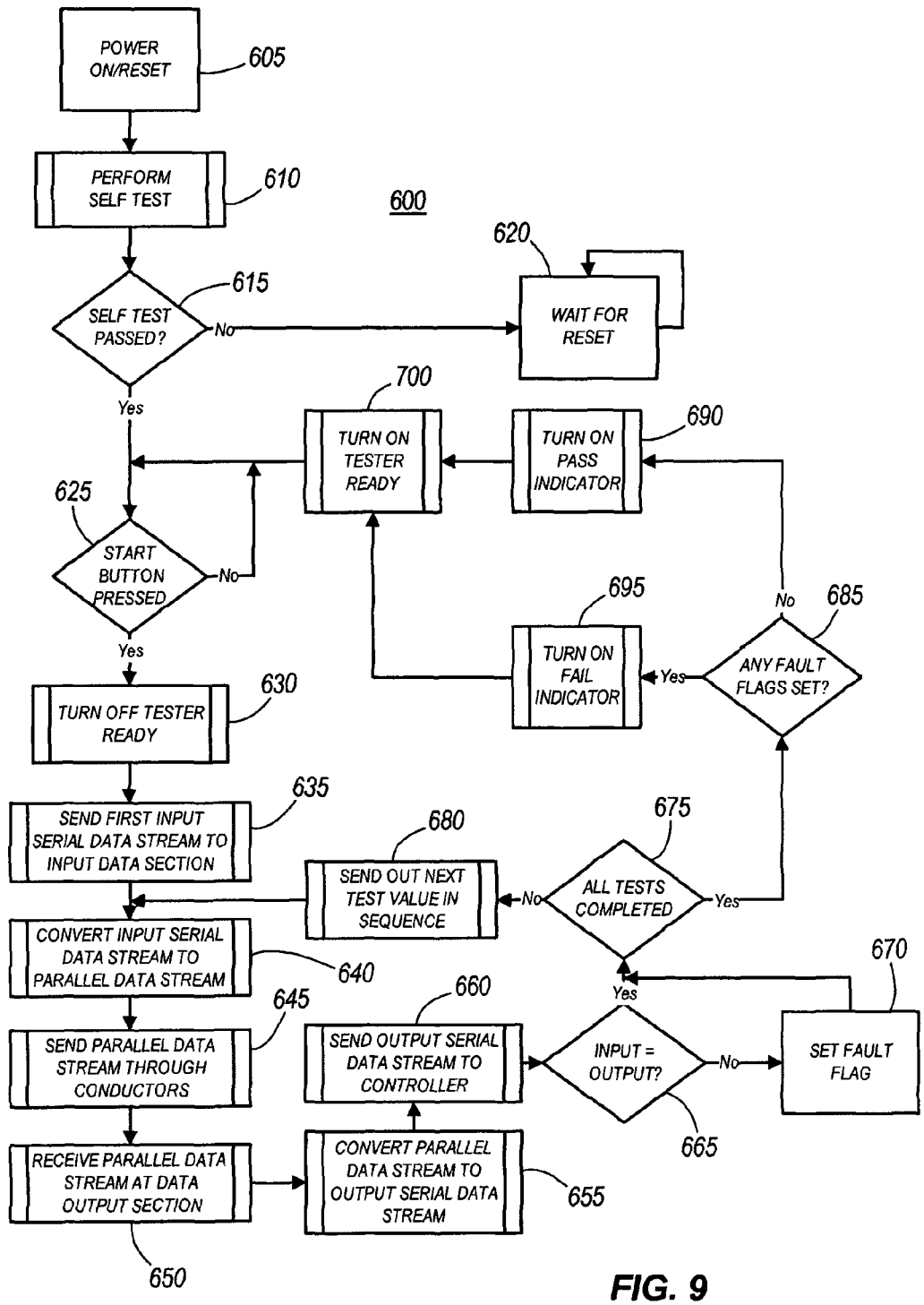
FIG. 9 is a flowchart of a cable testing process according to an embodiment of the invention.

FIG. 9 illustrates a process 600 for testing a cable or set of conductors. The testing process begins when the continuity tester 10 receives power or is reset (step 605) and a cable is attached to the tester 10. The tester 10 then performs a series of self-tests (step 610), such as verifying onboard RAM and resetting variables. If one or more of the self-tests fails (step 615), the LED 420 (FIG. 7) provides an indication to the user that one or more of the self-tests has failed. For example, the LED 420 blinks at a frequency of approximately 1 Hz and the tester waits for a reset button to be activated (step 620). In other embodiments, the instructions stored within the controller 15 are configured to provide different indications to the user corresponding to a failed self-test. If the tester 10 passes every self test, the controller 15 generates a signal to light the LED 420 to indicate that the tester 10 has completed all necessary self-tests and is ready to begin a test.

The user then initiates a test by activating a switch (e.g., a start button) coupled to the user interface 20 (step 625). The tester 10 continuously checks for the activation of the switch until activation is detected. Following the activation of the switch, the ready light is turned off (step 630) and the pass/fail indicators are activated (but not lighted). The controller 15 sends the first input serial data stream for testing to the data input section 25 (step 635). The controller 15 triggers the P/S line on the data input section and the first input serial data stream is converted to a first parallel stream of test data (step 640), as described above. The first parallel stream of test data is then sent through the conductors under test (step 645). The parallel stream of test signals is received at the data output section 35 (step 650), and the controller 15 triggers the P/S line on the data output section to convert the first parallel stream of test data to a first output serial data stream (step 655), as described above. The first output serial data stream is clocked into the controller 15 (step 660) on the next clock pulse. The controller 15 compares the first input stream of serial test data with the first output stream of serial test data (step 665), stores a result of the comparison, and sets corresponding fault flags (step 670) (if any faults were detected). The controller 15 then determines whether all tests have been completed (step 675). If not all tests have been completed, the controller 15 sends the next input serial data stream to the data input section 25 (step 680) and repeats steps 640 to 675 until each possible combination and permutation (described below) of conductors has been tested. When each possible combination and permutation of conductors has been tested, the controller 15 determines whether any fault flags were set during the continuity test (step 685) (e.g., whether a short circuit condition and/or an open circuit condition was detected for any of the combinations or permutations of conductors). If no fault flags were set, a PASS LED is lighted (step 690) to indicate that each test was passed successfully. If fault flags were set, a FAIL LED is lighted (step 695) to indicate that at least one test failed. After steps 690 and 695 the tester ready LED is lighted (step 700) to indicate that tester is ready to perform another test.

An illustrative example of the operation of the tester 10 is described below with respect to an eight-conductor cable. After a switch or start button is activated, the controller 15 enables the STB line and sends the first serial stream of input test data ("00000000") to the data-in line 219 (See FIG. 4). The first input serial data stream is converted to a first parallel data stream and clocked into the integrated circuit 200 after the controller 15 sends a signal to the CLK 216 and STB 215 lines (FIG. 4). The parallel data is shifted into holding registers during positive clock transitions (rising edge). The parallel data then becomes immediately available on a parallel bus because the OE line 217 of integrated circuit 200 is permanently enabled (tied to the regulated 5V output of the power supply section). The parallel data is coupled to the cable under test via the buffer amplifiers, as described above (additional buffer amplifiers are available for cables with more than eight conductors). The parallel data then becomes available at the second end of the cable under test. The controller 15 pulls the P/S pin 320 of integrated circuit 300 high and the parallel data is asynchronously latched into the circuit 300. Depending on the integrated circuits used in the data output section 35, approximately 100 ns of setup time is required for the parallel data to be copied to the internal latch of circuit 300. The controller 15 then pulls the P/S pin 320 low, and the parallel data is converted to an output serial data stream. The output serial data stream from circuit 300 is sent to the controller 15 after the controller 15 sends a signal to the CLK line 315 of circuit 300.

After each of the eight data bits have been received by the controller 15, the controller 15 performs a logical comparison of the sent data and the received data. The result of the evaluation is stored, an internal status flag is updated, and the next data byte is sent to the cable under test. In this example, "00000001" (decimal 1) is then sent to the data input section 25. The above steps are then repeated and the results are stored by the controller 15. The next values "00000010" (decimal 2), "00000011"(decimal 3), "00000100" (decimal 4), etc. are sent from the controller 15 and compared to corresponding output serial data streams until each permutation and combination of conductors has been tested for an open circuit condition and a short circuit condition. The final test result signal is generated by the controller 15 to indicate whether the cable passed or failed the test. In other embodiments, a different number of conductors are tested which require a different number of tests to be performed.

The tester 10 tests each possible combination and permutation of conductors during a test to ensure detection and reconfirmation of open circuit and short circuit conditions. For the eight-conductor cable described above, the continuity tester progresses through and tests each of the 256 possible combinations for an eight-conductor cable. In addition to testing each of the 256 possible combinations, the continuity tester 10 also tests each permutation (e.g., an ordered sequence) of the conductors. The number of permutations of conductors for a cable under test is given by:

$$\frac{n!}{(n-k)!}$$

where n is the number of conductors being tested, k is the number of conductors that are selected for each permutation, and the operator (!) denotes evaluating the factorial of a non-negative integer. The number of combinations possible for a given set of conductors is then given by:

$$\frac{n!}{k!(n-k)!}$$

As an illustrative example, the number of permutations and combinations for a three-conductor cable are respectively given by:

$$\frac{3!}{(3-3)!} + \frac{3!}{(3-2)!} + \frac{3!}{(3-1)!} + \frac{3!}{(3-0)!} = 16$$

$$\frac{3!}{3!(3-3)!} + \frac{3!}{2!(3-2)!} + \frac{3!}{1!(3-1)!} + \frac{3!}{0!(3-0)!} = 8$$

which results in a total of 24 combinations and permutations of the conductors which are tested (as opposed to only testing the 8 different combinations).

In addition to the permutations and combinations of conductors that are tested, a user can also customize the firmware within the continuity tester 10 for a given cable or cable type. For example, in some applications, conductors are intentionally tied together such that the conductors are at the same voltage level. In many instances, a set of pins that must both be maintained at, for example, 5V, are shorted together to ensure the desired voltage correlation. During a normal test, various conductors being shorted together results in a failed test. However, the user can access the executable instructions stored within the controller 15 using a program such as HyperTerminal (as described above) and adapt the testing procedure to accommodate the known exception(s) by defining at least one predefined relationship between conductors and/or input and output test signals. As a result, when the conductors are tested, the conductors pass the continuity test in spite of the stream of input test signals being different than the stream of output test signals. Additionally or alternatively, one or more of the conductors may have a null value which, when tested, appears as an open circuit. The exception can be programmed into the controller such that the detected open circuit condition does not trigger a failed test.

Thus, the invention provides, among other things, a multi-conductor cable continuity tester capable of testing combinations and permutations of conductors in a cable under test. In addition, the tester includes customizable firmware for defining relationships between conductors. Various features and advantages of the invention are set forth in the following claims.

What is claimed is:

1. A multi-conductor electrical continuity tester comprising:
  a controller configured to generate a first serial stream of input test signals, the first serial stream of input test signals including a plurality of signals equal in number to a plurality of conductors in a multi-conductor cable;
  a data input module configured to convert the first serial stream of input test signals into a first parallel stream of test signals;
  a data output module configured to receive and convert the first parallel stream of test signals to a first serial stream of output test signals;
  the controller further configured to receive the first serial stream of output test signals, store the first serial stream of output test signals to a memory, generate subsequent serial streams of input test signals corresponding to each possible combination and permutation of conductors, determine whether each possible combination and permutation of conductors includes an open circuit condition and/or a short circuit condition, and determine whether at least one predefined relationship between input and output test signals includes an open circuit condition and/or a short circuit condition, wherein the predefined relationship defines a stream of output test signals that are different than a stream of input test signals.

2. The continuity tester of claim 1, further comprising a communications port configured to transmit a result of the test to an external device.

3. The continuity tester of claim 1, further comprising a user interface.

4. The continuity tester of claim 1, further comprising a plurality of buffer amplifiers configured to condition the first parallel stream of test signals.

5. The continuity tester of claim 3, wherein the user interface includes at least one light emitting diode configured to indicate the result of the test.

6. The continuity tester of claim 3, wherein the user interface includes a switch configured to control the continuity tester.

7. The continuity tester of claim 1, wherein the data input section includes a plurality of cascaded integrated shift and store circuits.

8. The continuity tester of claim 2, wherein the communications port is configured to transfer a detailed listing and analysis of the test results.

9. The continuity tester of claim 3, wherein the user interface is configured to display a result of the test.

10. The continuity tester of claim 3, wherein the user interface is configured to provide an indication that the continuity tester is ready to begin a test.

11. A method for testing a multi-conductor cable for continuity, the method comprising:
  generating a first serial stream of input test signals, wherein the first serial stream of input test signals includes a plurality of signals equal in number to a plurality of conductors in the multi-conductor cable;
  converting the first serial stream of input test signals into a first parallel stream of test signals;
  buffering the first parallel stream of test signals;
  sending, through the cable, the first parallel stream of test signals to a data output module;
  converting the first parallel stream of test signals to a first serial stream of output test signals;
  sending the first serial stream of output test signals to a controller;
  storing the first serial stream of output signals to a memory;
  generating subsequent serial streams of input test signals corresponding to each possible combination and permutation of conductors;
  determining whether each possible combination and permutation of conductors includes an open circuit condition and/or a short circuit condition; and
  determining whether at least one predefined relationship between input and output test signals includes an open circuit condition and/or a short circuit condition, wherein the predefined relationship defines a stream of output test signals that are different than a stream of input test signals.

12. The method of claim 11, further comprising transmitting the result of the test through a communications port to an external device.

13. The method of claim 11, wherein buffering the first parallel stream of test signals includes conditioning the first parallel stream of test signals.

14. The method of claim 11, further comprising controlling an operation of the continuity tester using a switch.

15. The method of claim 11, further comprising transferring a detailed listing and analysis of the test results to an external device.

16. The method of claim 11, further comprising providing an indication that the continuity tester is ready to begin a test.

17. The method of claim 11, further comprising comparing the first serial stream of input test signals to the first serial stream of output test signals.

18. The method of claim 11, further comprising displaying a result of the test on a user interface.

19. The method of claim 18, wherein displaying a result of the test on the user interface includes lighting at least one light emitting diode.

* * * * *